(12) United States Patent
Tomiha et al.

(10) Patent No.: US 10,353,024 B2
(45) Date of Patent: Jul. 16, 2019

(54) MAGNETIC RESONANCE IMAGING APPARATUS

(71) Applicant: Toshiba Medical Systems Corporation, Otawara-shi (JP)

(72) Inventors: Sadanori Tomiha, Nasushiobara (JP); Kazuya Okamoto, Saitama Chuo-ku (JP); Manabu Ishii, Otawara (JP); Satoshi Imai, Nasushiobara (JP); Mitsuo Takagi, Otawara (JP); Miyuki Ota, Otawara (JP)

(73) Assignee: Toshiba Medical Systems Corporation, Otawara-shi (JP)

( * ) Notice: Subject to any disclaimer, the term of this patent is extended or adjusted under 35 U.S.C. 154(b) by 149 days.

(21) Appl. No.: 15/353,246

(22) Filed: Nov. 16, 2016

(65) Prior Publication Data

US 2017/0153303 A1    Jun. 1, 2017

(30) Foreign Application Priority Data

Nov. 30, 2015   (JP) .................................. 2015-233611

(51) Int. Cl.
  *G01R 33/34* (2006.01)
  *G01R 33/30* (2006.01)
  *G01R 33/3415* (2006.01)

(52) U.S. Cl.
  CPC ....... *G01R 33/34007* (2013.01); *G01R 33/30* (2013.01); *G01R 33/3415* (2013.01); *G01R 33/34084* (2013.01)

(58) Field of Classification Search
  CPC .... G01R 33/307; G01R 33/30; G01R 33/302; G01R 33/31; G01R 33/305

USPC ......................................................... 324/321
See application file for complete search history.

(56) References Cited

U.S. PATENT DOCUMENTS

| | | | | |
|---|---|---|---|---|
| 7,884,605 | B2* | 2/2011 | Tamura | G01R 33/3873 324/318 |
| 8,981,777 | B2* | 3/2015 | Biber | G01R 33/3415 324/318 |
| 9,547,055 | B2* | 1/2017 | Biber | G01R 33/3664 |
| 2003/0076103 | A1* | 4/2003 | Okada | G01R 33/34046 324/321 |
| 2007/0007962 | A1* | 1/2007 | Mraz | F17C 13/08 324/318 |
| 2007/0143921 | A1* | 6/2007 | Hiyama | A61B 5/0555 5/601 |

(Continued)

FOREIGN PATENT DOCUMENTS

| | | |
|---|---|---|
| JP | 6-315473 | 11/1994 |
| JP | 2005-87523 | 4/2005 |

(Continued)

*Primary Examiner* — Christopher P McAndrew
(74) *Attorney, Agent, or Firm* — Oblon, McClelland, Maier & Neustadt, L.L.P.

(57) ABSTRACT

A magnetic resonance imaging apparatus according to an embodiment includes a plurality of first coil elements and a connector. The first coil elements are embedded in a couchtop on which a subject is placed. The connector is provided in such a region of the couchtop that is positioned on the inside of the loop of at least one of the first coil elements. It is possible to attach and detach a second coil element different from the first coil elements to and from the connector.

15 Claims, 10 Drawing Sheets

(56) References Cited

U.S. PATENT DOCUMENTS

| | | | | |
|---|---|---|---|---|
| 2007/0282192 A1* | 12/2007 | Rezzonico | A61B 5/0555 | 600/415 |
| 2008/0204026 A1* | 8/2008 | Tsuchiya | G01R 33/28 | 324/321 |
| 2009/0009171 A1* | 1/2009 | Tamura | G01R 33/3815 | 324/320 |
| 2010/0066367 A1* | 3/2010 | Ma | G01R 33/307 | 324/318 |
| 2011/0169491 A1* | 7/2011 | Biber | G01R 33/3415 | 324/318 |
| 2012/0068710 A1* | 3/2012 | Biber | G01R 33/3415 | 324/321 |
| 2012/0100546 A1* | 4/2012 | Lowery, Jr. | C12Q 1/6895 | 435/6.12 |
| 2012/0161767 A1* | 6/2012 | Hardy | G01R 33/3642 | 324/318 |
| 2013/0009641 A1* | 1/2013 | Hori | G01R 33/3852 | 324/309 |
| 2013/0176029 A1* | 7/2013 | Oosawa | A61B 5/0555 | 324/321 |
| 2013/0207655 A1* | 8/2013 | Biber | G01R 33/341 | 324/321 |
| 2013/0241547 A1* | 9/2013 | Biber | G01R 33/3415 | 324/307 |
| 2014/0159719 A1* | 6/2014 | Chon | G01R 33/3415 | 324/309 |
| 2015/0008922 A1* | 1/2015 | Velders | G01R 33/302 | 324/309 |
| 2015/0168513 A1 | 6/2015 | Mori et al. | | |
| 2016/0329837 A1* | 11/2016 | Kataoka | H02N 2/142 | |

FOREIGN PATENT DOCUMENTS

| | | |
|---|---|---|
| JP | 2007-54143 | 3/2007 |
| JP | 2014-61282 | 4/2014 |

* cited by examiner

MAGNETIC RESONANCE IMAGING APPARATUS

CROSS-REFERENCE TO RELATED APPLICATIONS

This application is based upon and claims the benefit of priority from Japanese Patent Application No. 2015-233611, filed on Nov. 30, 2015; the entire contents of which are incorporated herein by reference.

FIELD

Embodiments described herein relate generally to magnetic resonance imaging.

BACKGROUND

Conventionally, magnetic resonance imaging apparatuses are apparatuses configured to generate an image by applying a Radio Frequency (RF) pulse to a subject placed in a static magnetic field and detecting Magnetic Resonance (MR) signals thereby emitted from the subject. Generally speaking, magnetic resonance imaging apparatuses include a receiver coil used for receiving the MR signals. In recent years, as the receiver coil, a large number of RF coils of various types each prepared for a specific imaging site are used.

DETAILED DESCRIPTION

A magnetic resonance imaging (MRI) apparatus according to an embodiment includes a plurality of first coil elements and a connector. The first coil elements are embedded in a couchtop on which a subject is placed. The connector is provided in such a region of the couchtop that is positioned on the inside of the loop of at least one of the first coil elements. It is possible to attach and detach a second element different from the first coil elements to and from the connector.

First Embodiment

Figure 1:
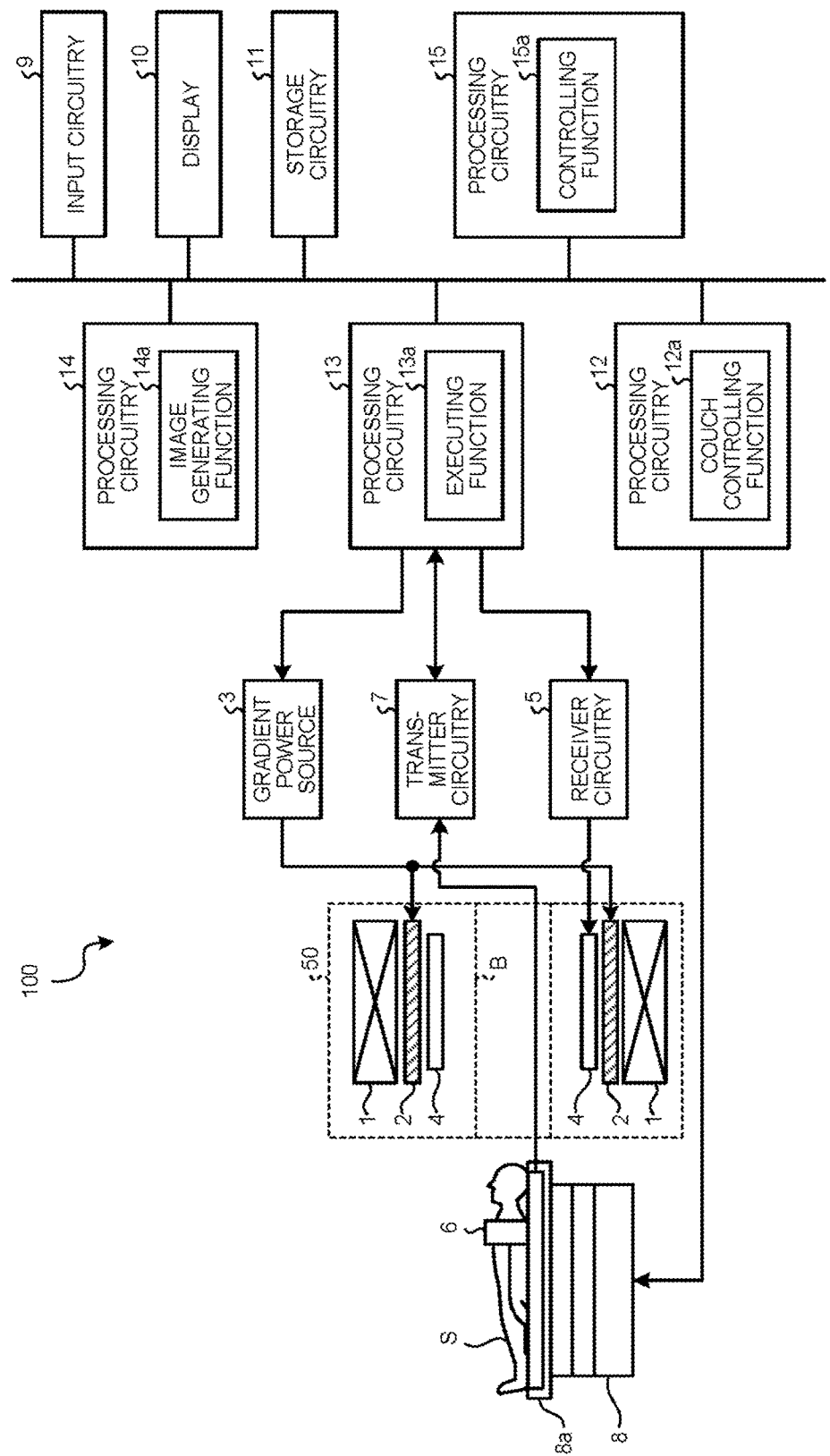
FIG. 1 is a diagram illustrating an exemplary configuration of a Magnetic Resonance Imaging (MRI) apparatus according to a first embodiment.

FIG. 1 is a diagram illustrating an exemplary configuration of an MRI apparatus according to a first embodiment. For example, as illustrated in FIG. 1, an MRI apparatus 100 includes a static magnetic field magnet 1, gradient coil 2, a gradient power source 3, a transmitter coil 4, transmitter circuitry 5, a receiver coil 6, receiver circuitry 7, a gantry 50, a couch 8, input circuitry 9, a display 10, storage circuitry 11, and processing circuitries 12 to 15.

The static magnetic field magnet 1 is formed to have a hollow and substantially circular cylindrical shape (which may have an oval cross-section orthogonal to the central axis thereof) and is configured to generate a static magnetic field in an imaging space formed on the inner circumferential side thereof. For example, the static magnetic field magnet 1 may be realized with a permanent magnet, a superconductive magnet, or the like.

The gradient coil 2 is formed to have a hollow and substantially circular cylindrical shape (which may have an oval cross-section orthogonal to the central axis thereof) and is disposed on the inner circumferential side of the static magnetic field magnet 1. The gradient coil 2 includes three coils configured to generate gradient magnetic fields along x-, y-, and z-axes, respectively, that are orthogonal to one another. In this situation, the x-axis, the y-axis, and the z-axis structure an apparatus coordinate system unique to the MRI apparatus 100. For example, the x-axis direction is set in the vertical direction, whereas the y-axis direction is set in the horizontal direction. Further, the z-axis direction is set so as to be the same as the direction of a magnetic flux in the static magnetic field generated by the static magnetic field magnet 1.

By individually supplying an electric current to each of the three coils included in the gradient coil 2, the gradient power source 3 is configured to cause gradient magnetic fields to be generated along the x-, y-, and z-axes, in the imaging space. The gradient power source 3 is able to cause the gradient magnetic fields to be generated along a read-cut direction, a phase-encoding direction, and a slice direction that are orthogonal to one another, by generating the gradient magnetic fields along the x-, y-, and z-axes, as appropriate. In this situation, the axes extending along the read-out direction, the phase-encoding direction, and the lice direction structure a logical coordinate system used for defining slice regions or a volume region serving as a target of an imaging process. In the following sections, the gradient magnetic field generated along the read-out direction will be referred to as a read-out gradient magnetic field; the gradient magnetic field generated along the phase-encoding direction will be referred to as a phase-encoding gradient magnetic field; and the gradient magnetic field generated along the slice direction will be referred to as a slice gradient magnetic field.

In the present example, the gradient magnetic fields are superimposed on the static magnetic field generated by the static magnetic field magnet 1 and are used for appending spatial position information to magnetic resonance (MR) signals. More specifically, the read-out gradient magnetic field appends position information along the read-out direction to an MR signal, by varying the frequency of the MR signal in accordance with the position in the read-out direction. Further, the phase-encoding gradient magnetic field appends position information in the phase-encoding direction to an MR signal, by varying the phase of the MR signal along the phase-encoding direction. Further, when an imaging region is represented by slice regions, the slice gradient magnetic field is used for determining the orientations, the thicknesses, and the quantity of the since regions. In contrast, when the imaging region is represented by a volume region, the slice gradient magnetic field appends position information along the slice direction to an MR signal, by varying the phase of the MR signal in accordance with the position in the slice direction.

The transmitter coil 4 is an RF coil configured to apply an RF pulse to the imaging space. More specifically, the transmitter coil 4 is formed to have a hollow and substantially circular cylindrical shape (which may have an oval cross-section orthogonal to the central axis thereof) and is disposed on the inside of the gradient coil 2. Further, the transmitter coil 4 is configured to apply a Radio Frequency (RF) pulse output from the transmitter circuitry 5 to the imaging space.

The transmitter circuitry 5 is configured to output the RF pulse corresponding to a Larmor frequency to the transmitter coil 4. For example, the transmitter circuitry 5 includes an oscillation circuit, a phase selecting circuit, a frequency converting circuit, an amplitude modulating circuit, and an RF amplifying circuit. The oscillation circuit is configured to generate an RF pulse having a resonant frequency unique to a targeted atomic nucleus placed in the static magnetic field. The phase selecting circuit is configured to select a phase of the RF pulse output from the oscillation circuit. The frequency converting circuit is configured to convert the frequency of the RF pulse output from the phase selecting circuit. The amplitude modulating circuit is configured to modulate the amplitude of the RF pulse output from the frequency converting circuit, according to a sinc function, for example. The RF amplifying circuit is configured to amplify the RF pulse output from the amplitude modulating circuit and to output the amplified RF pulse to the transmitter coil 4.

The receiver coil 6 is an RF coil configured to receive MR signals emitted from a subject S. More specifically, the receiver coil 6 is an RF coil attached to the subject S placed in the imaging space and configured to receive the MR signals emitted from the subject S due to an influence of the RF magnetic field applied by the transmitter coil 4. Further, the receiver coil 6 is configured to output the received MR signals to the receiver circuitry 7. For example, as the receiver coil 6, an exclusively-used coil is employed for each site serving as an imaging target. In this situation, the exclusively-used coil may be, for example, a receiver coil for the head, a receiver coil for the neck, a receiver coil for a shoulder, a receiver coil for the chest, a receiver coil for the abdomen, a receiver coil for a leg, a receiver coil for the spine, or the like.

The receiver circuitry 7 is configured to generate MR signal data on the basis of the MR signals output from receiver coil 6 and to output the generated MR signal data to the processing circuitry 13. For example, the receiver circuitry 7 includes a selecting circuit, a pre-amplifying circuit, a phase detecting circuit, and an analog/digital converting circuit. The selecting circuit is configured to selectively receive an input of the MR signals output from the receiver coil 6. The pre-amplifying circuit is configured to amplify the MR signals output from the selecting circuit. The phase detecting circuit is configured to detect the phases of the MR signals output from the pre-amplifying circuit. The analog/digital converting circuit is configured to generate the MR signal data by converting analog signals output from the phase detecting circuit into digital signals and to output the generated MR signal data to the processing circuitry 13.

In the present example, the situation in which the transmitter coil 4 applies the RF pulse so that the receiver coil 6 receives the MR signals is explained; however, possible embodiments of the transmitter coil and the receiver coil are not limited to this example. For instance, the transmitter coil 4 may further have a receiving function to receive the MR signals. Further, the receiver coil 6 may further have a transmitting function to apply an RF magnetic field. When the transmitter coil 4 has the receiving function, the receiver circuitry 7 generates MR signal oats also from the MR signals received by the transmitter coil 4. Further, when the receiver coil 6 has the transmitting function, the transmitter circuitry 5 outputs an RF pulse also to the receiver coil 6.

The gantry 50 has a bore B forming the imaging space. More specifically, the gantry 50 has the bore B formed to have a circular cylindrical shape and is configured to support the static magnetic field magnet 1, the gradient coil 2, and the transmitter coil 4 that are arranged around the bore B.

The couch 8 includes a couchtop 8a on which the subject S is placed. When an imaging process is performed on the subject S, the couchtop 8a is inserted into the imaging space formed on the inside of the static magnetic field magnet and the gradient coil 2. For example, the couch 8 is installed in such a manner that the longitudinal direction thereof extends parallel to the central axis of the static magnetic field magnet 1.

The input circuitry 9 is configured to receive operations to input various types of instructions and various types of information from an operator. More specifically, the input circuitry 9 is connected to the processing circuitry 15 and is configured to convert each of the input operations received from the operator into an electrical signal and to output the electrical signal to the processing circuitry 15. For example, the input circuitry 9 is realized with a trackball, a switch button, a mouse, a keyboard, a touch panel, and/or the like.

The display 10 is configured to display various types of information and various types of images. More specifically, the display 10 is connected to the processing circuitry 15 and is configured to convert data of the various types of information and the various types of images sent thereto from the processing circuitry 15, into display-purpose electrical signals and to output the display-purpose electrical signals. For example, the display 10 is realized with a liquid crystal monitor, a Cathode Ray Tube (CRT) monitor, a touch panel, or the like.

The storage circuitry 11 is configured to store various types of data therein. More specifically, the storage circuitry 11 is configured to store therein the MR signal data and image data for each subject S. For example, the storage circuitry 11 is realized with a semiconductor memory device such as a Random Access Memory (RAM), a flash memory, or the like, or a hard disk, an optical disk, or the like.

The processing circuitry 12 includes a couch controlling function 12a. For example, the processing circuitry 12 is realized with a processor. The couch controlling function 12a is connected to the couch 8 and is configured to control operations of the couch 8 by outputting a control-purpose electrical signal to the couch 8. For example, the couch controlling function 12a receives, via the input circuitry 9, an instruction to move the couchtop 8a in a longitudinal direction, an up-and-down direction, or a left-and-right direction from the operator and operates a driving mechanism for the couchtop 8a included in the couch 8 so as to move the couchtop 8a according to the received instruction.

The processing circuitry 13 includes an executing function 13a. For example, the processing circuitry 13 is realized with a processor. The executing function 13a is configured to execute various types of pulse sequences on the basis of an imaging condition set by the operator. More specifically, the executing function 13a executes the various types of pulse sequences by driving the gradient power source 3, the transmitter circuitry 5, and the receiver circuitry 7 on the basis of sequence execution data output from the processing circuitry 15.

In this situation, the sequence execution data is information that defines a pulse sequence indicating a procedure performed to acquire the MR signal data. More specifically, the sequence execution data is information that defines: the timing with which the electric current is to be supplied from the gradient power source 3 to the gradient coil 2 and the intensity of the electric current to be supplied; the intensity of an RF pulse current to be supplied from the transmitter circuitry 5 to the transmitter coil 4 and the timing with which the RF pulse current is to be supplied; the timing with which the MR signals are to be detected by the receiver circuitry 7, and the like.

Further, as a result of executing the various types of pulse sequences, the executing function 13a is configured to receive the MR signal data from the receiver circuitry 7 and to store the received MR signal data into the storage circuitry 11. In this situation, a set made up of pieces of MR signal data received by the executing function 13a is stored, into the storage circuitry 11, as data structuring a k-space, by being arranged either two-dimensionally or three-dimensionally in accordance with the position information appended by the read-out gradient magnetic field, the phase-encoding gradient magnetic field, and the slice gradient magnetic field described above.

The processing circuitry 14 includes an image generating function 14a. For example, the processing circuitry 14 is realized with a processor. The image generating function 14a is configured to generate an image, on the basis of the MR signal data stored in the storage circuitry 11. More specifically, the image generating function 14a generates the image by reading the MR signal data stored in the storage circuitry 11 by the executing function 13a and performing a post-processing process, i.e., a reconstructing process such as a Fourier transform on the read MR signal data. Further, the image generating function 14a is configured to store image data of the generated image into the storage 11.

The processing circuitry 15 includes a controlling function 15a. For example, the processing circuitry 15 is realized with a processor. The controlling function 15a is configured to exercise overall control of the MRI apparatus 100 by controlling constituent elements included in the MRI apparatus 100. For example, the controlling function 15a is configured to receive, via the input circuitry 9, inputs of various types of parameters related to a pulse sequence from the operator and to generate the sequence execution data on the basis of the received parameters. After that, by transmitting the generated sequence execution data to the processing circuitry 13, the controlling function 15a is configured to execute the various types of pulse sequences. Further, for example, the controlling function 15a is configured to read the image data of an image requested by the operator from the storage circuitry 11 and to output the read image to the display 10.

In this situation, for example, the processing functions of the processing circuits 12 to 15 described above are stored in the storage circuitry 11 in the form of computer-executable programs. The processing circuitries realize the processing functions corresponding to the programs by reading the programs from the storage circuitry 11 and executing the read programs. In other words, the processing circuitries 12 to 15 that have read the programs each have the processing function illustrated in FIG. 1.

Although FIG. 1 illustrates the example in which a single processing circuit realizes each of the processing functions such as the couch controlling function 12a, the executing function 13a, the image generating function 14a, and the controlling function 15a, possible embodiments are not limited to this example. The processing functions may be realized as being distributed or integrated together into one processing circuit or a plurality of processing circuits, as appropriate.

Further, the term "processor" above used in the embodiments denotes, for example, a Central Processing Unit (CPU), a Graphics Processing Unit (GPU), or a circuit such as an Application Specific Integrated Circuit (ASIC) or a programmable logic device (e.g., a Simple Programmable Logic Device [SPLD], a Complex Programmable Logic Device [CPLD], or a Field Programmable Gate Array [FPGA]). It is also acceptable to directly incorporate the programs into the circuit of the processor, instead of storing the programs in the storage circuitry. In that situation, the processor realizes the functions by reading and executing the programs incorporated in the circuit thereof. Further, as for the processors according to any of the embodiments, each of the processors may be structured as a single circuit. Alternatively, it is also acceptable to realize the functions thereof by structuring a single processor by combining together a plurality of independent circuits.

An exemplary configuration of the MRI apparatus 100 according to the first embodiment has thus been explained. The MRI apparatus 100 according to the first embodiment configured as described above is capable of reducing cumbersomeness that may be experienced during handling of the RF coils.

Generally speaking, in an MRI apparatus, RF coils used as a receiver coil are connected to the apparatus main body via cables. For this reason, for example, when a large number of RF coils are used as the receiver coil, settings and operations of the RF coils can be cumbersome because handling of the cables becomes complicated. Further, when handling of the cables positioned between the RF coils and the apparatus main body is complicated, a loop involving a human body may be formed. Thus, as RF coils are developed to correspond to a larger number channels, there is a growing demand for reducing the number of cables.

To meet the demand, the MRI apparatus 100 according to the first embodiment includes: a plurality of coil elements embedded in the couchtop 8a; and at least one connector which is provided in such a region of the couchtop 8a that is positioned on the inside of the loop of at least one of the coil elements and to and from which it is possible to attach and detach a coil element different from the coil elements. In other words, the MRI apparatus 100 according to the first embodiment is configured so that a coil element is connected, in a cableless manner, to each of the one or more connectors provided on the couchtop 8a.

By using this configuration, it is possible to directly connect the coil elements to the apparatus main body without using any cables. It is therefore possible to reduce the cumbersomeness that may be experienced during the handling of the RF coils. In the following sections, an example of the configuration will be explained in detail.

Figure 2:
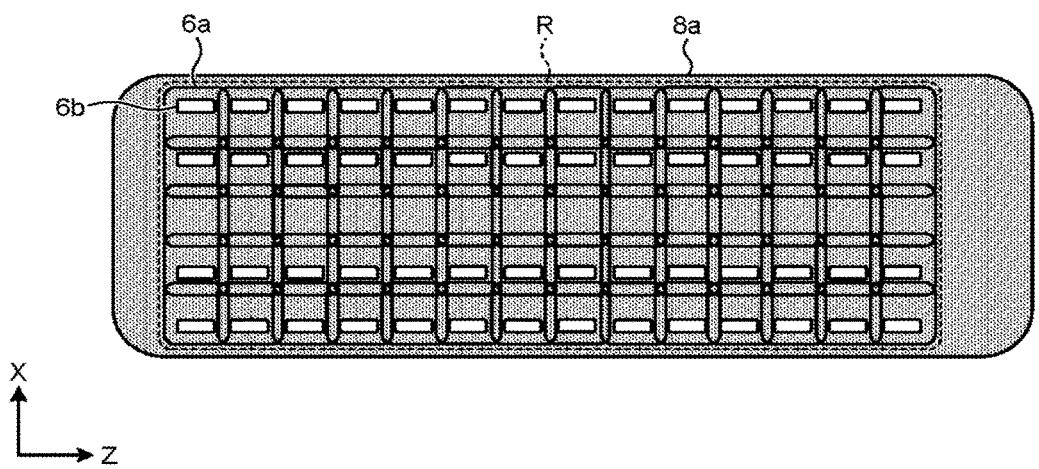
FIGS. 2 and 3 are drawings of examples of coil elements provided in a couchtop according to the first embodiment.
Figure 3:
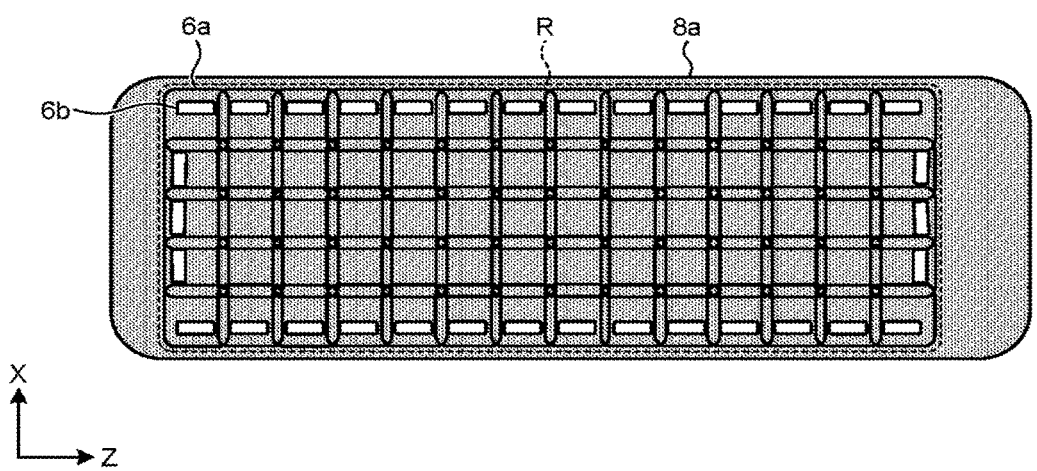

FIGS. 2 and 3 are drawings of examples of the oil elements provided in the couchtop according to the first embodiment. For example, illustrated in FIGS. 2 and 3, the couchtop 8a has embedded therein an array coil in which a plurality of coil elements 6a are arranged in a plurality of arrays along the longer-side direction and the shorter-side direction. For example, the array coil may be used as the receiver coil 6 for the spine. The coil elements 6a are examples of the first coil elements in the claims.

In the first embodiment, on the couchtop 8a, each of the connectors 6b is provided in a region on the inside of the loop of a corresponding one of a certain number of coil elements 6a among the coil elements 6a. In this situation, for example, when the area in which the coil elements 6a are embedded in the couchtop 8a is defined as a subject region R, each of the connectors 6b is arranged so as to be positioned close to an end part of the subject region R.

For example, as illustrated in FIG. 2, the connectors 6b may be provided for the coil elements 6a arranged in the arrays closest to the end parts in terms of the shorter-side direction of the couchtop 8a (i.e., the first array from the top and the first array from the bottom in FIG. 2) and for the coil elements 6a arranged in the arrays positioned adjacent thereto on the inside thereof (i.e., the second array from the top and the second array from the bottom in FIG. 2).

Alternatively, for example, as illustrated in FIG. 3, the connectors 6b may be provided for the coil elements 6a arranged in the arrays closest to the end parts in terms of the shorter-side direction of the couchtop 8a (i.e., the first array from the top and the first array from the bottom in FIG. 3) and for the coil elements 6a arranged in the arrays closest to the end parts in terms of the longer-side direction of the couchtop 8a (i.e., the first array from the left and the first array from the right in FIG. 3).

In this situation, when an imaging process is performed, because the subject to the imaging process is placed in the subject region R, if the connectors were arranged around the center of the subject region R, the frequency with which the connectors are used would be low. Thus, by arranging the coil elements 6a in the region close to the end parts of the subject region R as described above, it is possible to eliminate connectors that would be used less frequently.

Further, the connectors 6b provided on the couchtop 8a are each connected to the receiver circuitry 7 illustrated in FIG. 1, so that it is possible to attach and detach a coil element different from the coil elements 6a embedded in the couchtop 8a, to and from any of the connectors 6b. With this configuration, when such a coil element is attached to any of the connectors 6b, the MR signals received by the coil element are sent to the receiver circuitry 7. It should be noted that the coil elements 6a embedded in the couchtop 8a are also each connected to the receiver circuitry 7.

Figure 4:
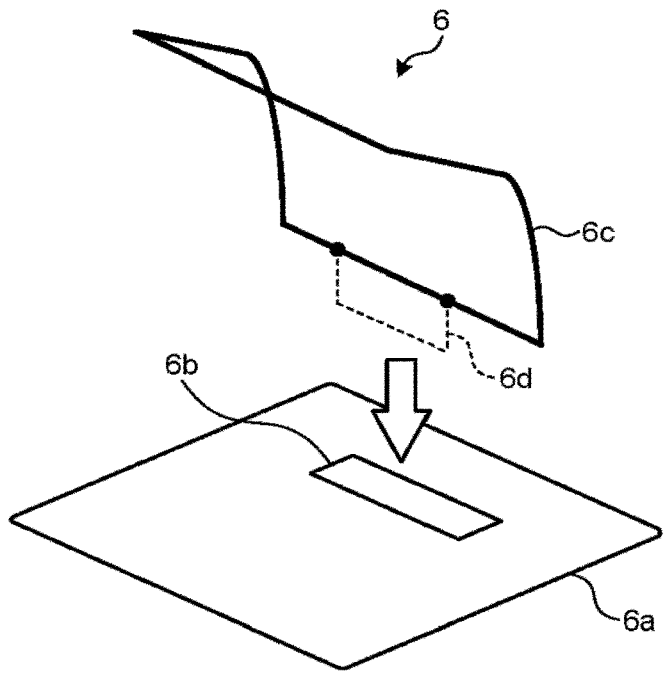
FIGS. 4 and 5 are drawings of an example of a coil element attached to one of connectors provided on the couchtop side according to the first embodiment.
Figure 5:
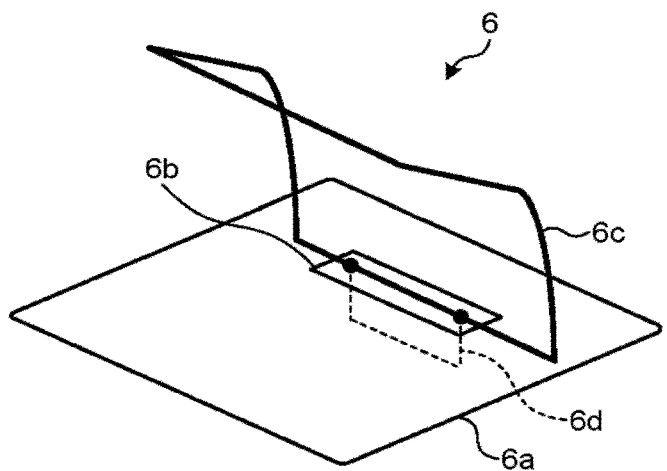

FIGS. 4 and 5 are drawings of an example of a coil element attached to one of the connectors provided on the couchtop side according to the first embodiment. FIGS. 4 and 5 each conceptually illustrate the loops in the coil elements and the connectors. Accordingly, other component parts of the coil elements such as the casings, circuits, and the like are omitted from the drawings.

For example, as illustrated in FIG. 4, a coil element to be attached to the connector 6b provided on the couchtop 8a side has a connector 6d. The connector 6b provided on the couchtop 8a side is electrically connected to the coil element 6c as a result of being fitted to the connector 6d. In other words, the coil element 6c is connected, in a cableless manner, to the connector 6b provided on the couchtop 8a side. In the present example, the coil element 6c is an example of the second coil element in the claims.

In this situation, as a result of the coil element 6c being fitted to the connector 6b, the coil element 6a and the coil element 6c form a receiver coil 6 corresponding to one imaging site. For example, as illustrated in FIG. 5, while the connector 6d is in the state of being fitted to the connector 6b, the coil element 6c is shaped so as to extend in the vertical direction from the couchtop 8a and then to be curved toward the inside of the couchtop 8a. As a result, for example, the coil element 6c forms the receiver coil 6 corresponding to a shoulder of the subject. In other words, in the present example, the shoulder of the subject is arranged on the inside of the substantially U-shaped receiver coil 6 formed by the coil element 6a and the coil element 6c.

Further, at least two of the coil elements 6a embedded in the couchtop 8a are embedded in the couchtop 8a so as to correspond to mutually-different imaging sites. For example, at least two of the coil elements 6a mentioned herein correspond to at least two imaging sites selected from among: the head, the neck, each shoulder, the chest, the abdomen, and each leg of the subject. In other words, by combining the coil element 6c described above with a certain one of the coil elements 6a embedded in the couchtop 8a, for example, it is possible to form a receiver coil for the head, a receiver coil for the neck, a receiver coil for a shoulder, a receiver coil for the chest, a receiver coil for the abdomen, or a receiver coil for a leg.

Figure 6:
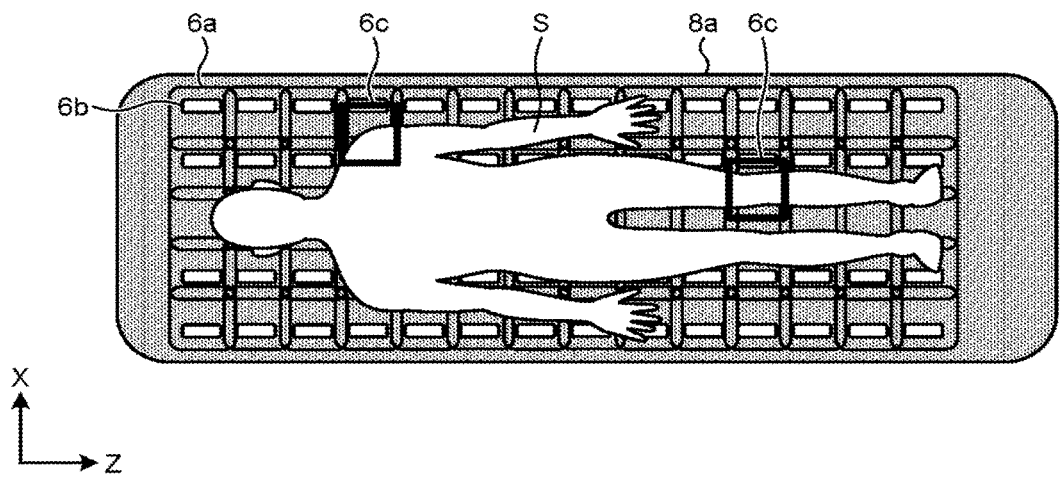
FIG. 6 is a drawing illustrating an example of correspondence between coil elements provided in the couchtop according to the first embodiment and imaging sites.

FIG. 6 is a drawing illustrating an example of correspondence between the coil elements provided in the couchtop according to the first embodiment and the imaging sites. For example, as illustrated in FIG. 6, the coil element 6c arranged in the position where a shoulder of the subject S is located when the subject S is placed on the couchtop 8a forms the receiver coil corresponding to the shoulder, as a result of the coil element 6c being attached to the connector 6b provided in the region on the inside of the loop of the coil element 6c. In contrast, for example, as illustrated in FIG. 6, the coil element 6c arranged in the position where a knee of the subject S is located when the subject S is placed on the couchtop 8a forms the receiver coil corresponding to the leg, as a result of the coil element 6c being attached to the connector 6b provided in the region on the inside of the loop of the coil element 6c.

In other words, each of the coil elements 6a embedded in the couchtop 8a forms a receiver coil corresponding to the site located in the position thereof when the subject S is placed on the couchtop 8a. For example, the coil element 6c arranged in the position where the head of the subject S is located forms the receiver coil corresponding to the head. The coil element 6c arranged in the position where the neck of the subject S is located forms the receiver coil corresponding to the neck. Further, for example, the coil element 6c arranged in the position where the chest of the subject S is located forms the receiver coil corresponding to the chest. Furthermore, the coil element 6c arranged in the position where the abdomen of the subject S is located forms the receiver coil corresponding to the abdomen.

By using this configuration, it is possible to form the receiver coils each of which corresponds to a different one of the various types of imaging sites, by attaching the coil element 6c to an arbitrary one of the connectors 6b provided on the couchtop 8a.

Next, the positions of the connectors 6b provided on the couchtop 8a according to the first embodiment will be explained in detail. As explained above, according to the first embodiment, each of the connectors 6b is provided in the region on the inside of the loop of a corresponding one of the coil elements 6a embedded in the couchtop 8a.

Figure 7:
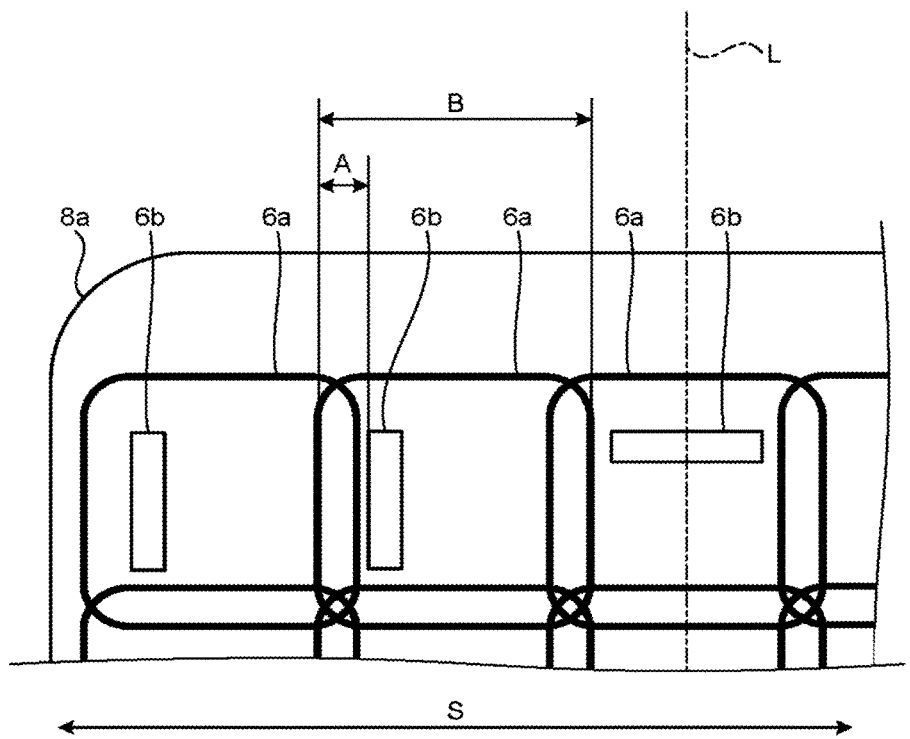
FIG. 7 is a drawing illustrating positions of connectors provided on the couchtop according to the first embodiment.

FIG. 7 is a drawing illustrating the positions of the connectors provided on the couchtop according to the first embodiment. In FIG. 7, the straight line L drawn with the dashed line indicates the central axis along the longer-side direction of the couchtop 8a, whereas the bidirectional arrow S indicates the shorter-side direction of the couchtop 8a.

For example, as illustrated in FIG. 7, each of the coil elements 6a embedded in the couchtop 8a is arranged in such a manner that a part of the region on the inside of the loop thereof overlaps the regions on the inside of the loops of other coil elements 6a positioned adjacent thereto. By arranging parts of the regions on the inside of the loops of the adjacently-positioned coil elements 6a to overlap one another in this manner, it is possible to realize decoupling between any of the coil elements 6c.

In that situation, for example, within the region on the inside of the loop of a corresponding one of the coil elements 6a, each of the connectors 6b is positioned in a region other than the parts overlapping the regions on the inside of the loops of the adjacently-positioned other coil elements 6a. Further, for example, each of the connectors 6b is provided in the region on the inside of the loop of a corresponding one of the coil elements 6a, so as to be positioned close to an end part of the couchtop 8a while being in the region other than the parts overlapping the regions on the inside of the loops of the adjacently-positioned other coil elements 6a. In this situation, the end part of the couchtop 8a may be an end part of the couchtop 8a in terms of the shorter-side direction may be an end part of the couchtop 8a in terms of the longer-side direction.

For example, as indicated by the second coil element 6a from the left in FIG. 7, the connector 6b is provided in such a region of the couchtop 8a that is positioned on the inside of the loop of the coil element 6a, so as to be positioned on the side (the left side of FIG. 7) close to the end part of the couchtop 8a in terms of the shorter-side direction, while being in the region other than the parts overlapping the regions on the inside of the loops of the adjacently-positioned other coil elements 6a. In other words, the connector 6b is provided in such a region of the couchtop 8a that is positioned on the inside of the loop of the coil element 6a so as to be positioned on the side away from the central axis extending along the longer-side direction of the couchtop 8a, while being in the region other than the parts overlapping the regions on the inside of the loops of the adjacently-positioned other coil elements 6a.

In this situation, for example, when the region on the inside of the loop of the coil element 6a is divided into two sections at the center of the loop in terms of the shorter-side direction of the couchtop 8a, the connector 6b is arranged on the inside of one of the two sectioned regions positioned closer to the end part of the couchtop 8a in terms of the shorter-side direction. In other words, when the region on the inside of the loop of the coil element 6a is divided into the two sections at the center of the loop in terms of the shorter-side direction of the couchtop 8a, the connector 6b is arranged on the inside of the one of the two sectioned regions positioned farther from the central axis extending along the longer-side direction of the couchtop 8a.

Further, as indicated by the third coil element 6a from the left in FIG. 7, the connector 6b is provided in the region on the inside of the loop of the coil element 6a, so as to be positioned on the side (the upper side of FIG. 7) close to the end part of the couchtop 8a in terms of the longer-side direction, while being in the region other than the parts overlapping the regions on the inside of the loops of the adjacently-positioned other coil elements 6a.

In this situation, for example, when the region on the inside of the loop of the coil element 6a is divided into two sections at the center of the loop in terms of the longer-side direction of the couchtop 8a, the connector 6b is arranged on the inside of one of the two sectioned regions positioned closer to the end part of the couchtop 8a in terms of the longer-side direction.

More specifically, for example, as illustrated in FIG. 7, the connector 6b is arranged in such a position that allows a distance A between the conductor forming the loop of the coil element 6a and the edge of the connector 6b to be equal to or smaller than 20% of a dimension B of the inside of the conductor of the coil element 6a.

By arranging, in the manner described above, the connector 6b to be in the position close to the end part of the couchtop 8a while being in the region on the inside of the loop of the coil element 6a, it is possible to keep large the area enclosed by the loop of the coil element 6a and the loop of the coil element 6c, when the coil element 6c shaped to be curved toward the inside of the couchtop 8a is combined. As a result, it is possible to effectively utilize the coil elements.

As explained above, according to the first embodiment, each of the connectors to and from which it is possible to attach and detach the coil element different from the coil elements is provided in the region on the inside of the loop of at least one of the coil elements embedded in the couchtop 8a. In other words, according to the first embodiment, it is possible to connect, in a cableless manner, the coil element to any of the connectors provided on the couchtop 8a. Consequently, according to the first embodiment, it is possible to directly connect one or more coil elements to the apparatus main body without using any cables. It is therefore possible to reduce the cumbersomeness that may be experienced during the handling of the receiver coil 6.

The MRI apparatus 100 according to the first embodiment described above may be implemented by modifying a part of the configuration thereof. Thus, in the following sections, modification examples of the MRI apparatus 100 described above will be explained as second to sixth embodiments. Overall configurations of the MRI apparatuses according to the embodiments explained below are basically the same as the configuration illustrated in FIG. 1. Accordingly, in the following sections, differences from the first embodiment described above will primarily be explained, and detailed explanations of some of the constituent elements that play the same roles as those of the constituent elements already explained will be omitted.

Second Embodiment

In a second embodiment, the MRI apparatus 100 described above is configured so that the couchtop 8a has either one or more projection sections or one or more recess sections formed to fit the shape of a subject and so that a connector 6b is arranged in a region on the inside of the loop of each of the coil elements 6a embedded in the projection sections or the recess sections.

Figure 8:
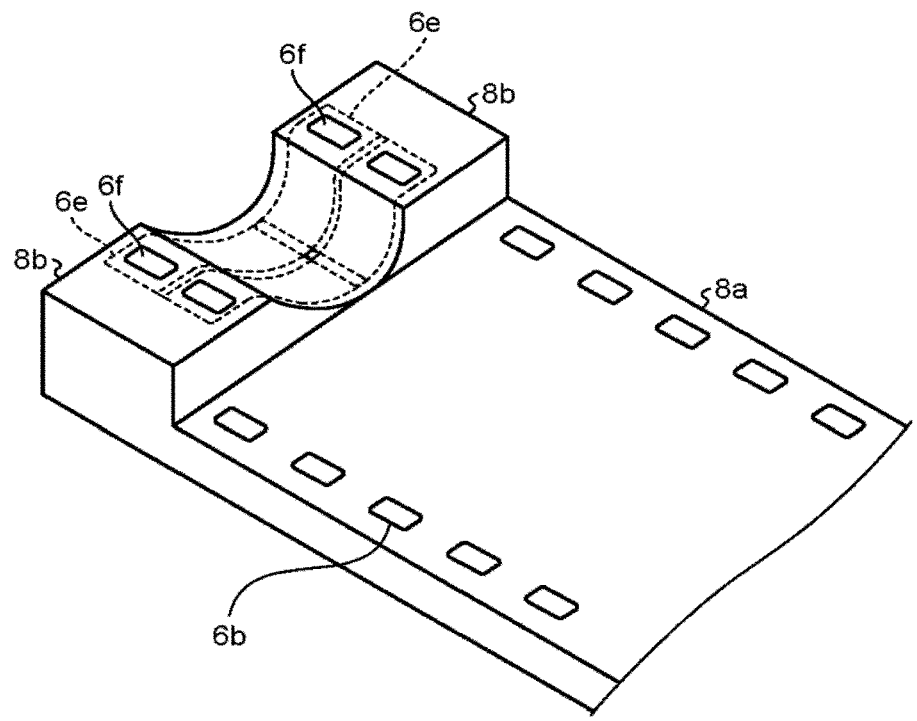
FIG. 8 is a drawing illustrating examples of coil elements provided in a couchtop according to a second embodiment.

FIG. 8 is a drawing illustrating examples of coil elements provided in a couchtop according to the second embodiment. For example, as illustrated in FIG. 8, the couchtop 8a according to the second embodiment includes two projection sections 8b formed on one end in terms of the longer-side direction. In this situation, the two projection sections 8b are formed so as to be symmetrical with respect to the direction in which the couchtop 8a is inserted into the bore B and so that the thickness (the height) of the couchtop 8a increases from the center of the couchtop 8a toward the outside thereof. In that situation, for example, the head of the subject is arranged in the position interposed between the two projection sections 8b.

In this situation, coil elements 6e are embedded in positions around the center of the couchtop 8a in each of the two projection sections 8b. Further, a connector 6f is provided in the region on the inside of the loop of each of the coil elements 6e embedded in each of the two projection sections 8b. For example, as a result of attaching the coil element 6c shaped to be curved toward the inside of the couchtop 8a as illustrated in FIGS. 4 and 5 to each of the connectors 6f, the coil elements 6c and the coil elements 6e are arranged so as to surround the head of the subject. Thus, a receiver coil for the head is formed.

In the explanation above, the example is explained in which the connectors 6f are provided in the projection sections 8b formed on the couchtop 8a; however, possible embodiments are not limited to this example. For instance, it is also acceptable to provide one or more connectors to and from which it is possible to attach and detach coil elements, in one or more recess sections formed on the couchtop 8a.

Further, in the explanation above, the example of the receiver coil for the head is described; however, possible embodiments are not limited to this example. For instance, it is also acceptable to provide a connector in such a region of the couchtop 8a that is positioned on the inside of the op of a coil element embedded in one or more projection sections or one or more recess sections formed to fit another site of the subject. For example, when projection sections are formed to fit the legs of the subject at the two ends and the center in terms of the shorter-side direction, on a side closer to an end part than to the center in terms of the longer-side direction of the couchtop 8a so that a coil element 6a is embedded in each of the three projection sections, the connector 6b may be provided on the inside of the loop of each of the coil elements 6a.

Third Embodiment

In a third embodiment, the MRI apparatus 100 described above is configured so that the connector 6d provided for the coil element 6c is movable relative to the loop of the coil element 6c.

Figure 9:
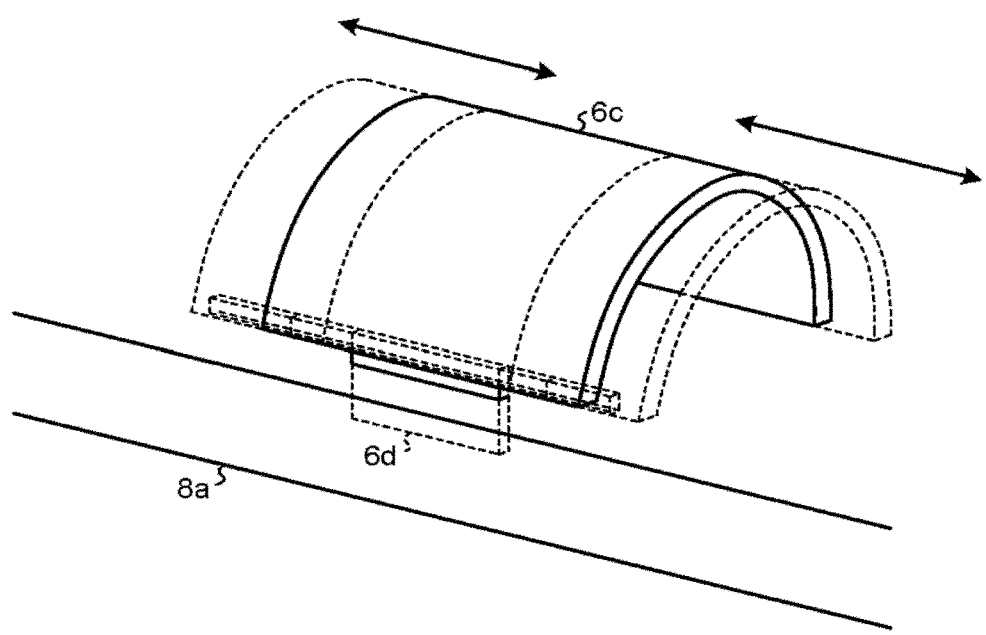
FIG. 9 is a drawing illustrating an example of a coil element provided in a couchtop according to a third embodiment.

FIG. 9 is a drawing illustrating an example of a coil element provided in a couchtop according to the third embodiment. For example, as illustrated in FIG. 9, the coil element 6c according to the third embodiment has a connector 6d. In this situation, the connector 6d is provided so as to be movable relative to the loop of the coil element 6c. For example, as illustrated in FIG. 9, the connector 6d is provided so as to be slidable along the edge of the casing that has the loop built therein and is curved in an arc shape.

As explained above, as a result of providing the connector 6d so as to be movable relative to the loop of the coil element 6c, the coil element 6c is able to move along the surface of the couchtop 8a, while the connector 6d is in the state of being fitted to a connector provided on the couchtop 8a side. Consequently, for example, it is possible to arrange the coil element 6c to be in any arbitrary position of the subject within the movable range of the coil element 6c, without the need to remove the connector 6d. It is therefore possible to improve the level of convenience of the coil element 6c. Further, because it is possible to expand the range in which the single coil element 6c is able to receive MR signals, it is possible to reduce the quantity of connectors 6b to be provided on the couchtop 8a. It is therefore possible to reduce manufacturing costs of the couchtop 8a.

Fourth Embodiment

In a fourth embodiment, the MRI apparatus 100 described above is configured so that the coil elements 6a include a first layer including a plurality of coil elements 6g each having a first area size and a second layer including a plurality of coil elements 6h each having a second area size larger than the first area size and so that the first layer and the second layer are embedded in the couchtop 8a while being laminated.

Figure 10:
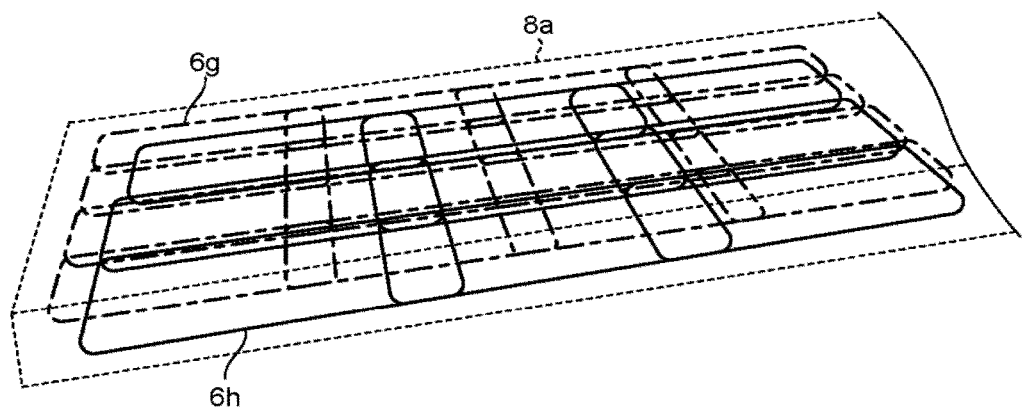
FIG. 10 is a drawing illustrating examples of elements provided in a couchtop according to a fourth embodiment.

FIG. 10 is a drawing illustrating examples of coil elements provided in a couchtop according to a fourth embodiment. For example, as illustrated in FIG. 10, in the couchtop 8a according to the fourth embodiment, two array coils are arranged while being laminated. The array coil in the upper layer includes the coil elements 6g, whereas the array coil in the lower layer includes the coil elements 6h.

In this situation, the loop of each of the coil elements 6g arranged in the upper layer is smaller in area than the loop of each of the coil elements 6h arranged in the lower layer. In other words, in the couchtop 8a, the coil elements of which the loops each have the smaller area are arranged on the side closer to the subject, whereas the coil elements of which the loops each have the larger area are arranged on the side farther from the subject.

Although not illustrated in FIG. 10, similarly to the embodiments described above, in the fourth embodiment also, each of the connectors to and from which it is possible attach and detach another coil element is provided in the region on the inside of the loop of a corresponding one of the coil elements included in the array coils arranged in the two layers.

Further, for example, it is possible to switch between the array coils arranged in the two layers, in accordance with an imaging condition set by the operator, so that one of the array coils is used for an imaging process.

Generally speaking, when coil elements of which the loops each have a small area are used, it is known that the obtained image exhibits higher levels of brightness for a site positioned close to the coils and lower levels of brightness for a site positioned distant from the coils, while the ON ratios are substantially equal between the two sites. On the contrary, when coil elements of which the loops each have a large area are used, it is known that the obtained image relatively clearly renders even a site in a deep position within the subject.

For these reasons, for example, the connection is switched between the reception paths connected to the array coils, so as to use the array coil being arranged in the upper layer and having the smaller loop area for the imaging process when the imaging site is in a position close to the body surface of the subject and so as to use the array coil being arranged in the lower layer and having the larger loop area when the imaging site is in a deep position within the subject.

As explained above, by using the array coils that are arranged in the two layers and have the mutually-different loop areas, it is possible to obtain a more appropriate image depending on the imaging site and the purpose of the imaging taking process.

Fifth Embodiment

In a fifth embodiment, the MRI apparatus 100 described above is configured so as to further include a lid mechanism that closes altogether the connectors 6b which are provided on the couchtop 8a side and to which no coil element 6c is attached. The lid mechanism is configured to close the connectors 6b to which no coil element 6c is attached and, at the same time, to arrange the coil element 6c attached to any of the connectors 6b to be fixed to the connector 6b. Further, when the couchtop 8a is arranged on the inside of the bore B, the lid mechanism is configured to close the connectors 6b to which no coil element 6c is attached.

Figure 11:
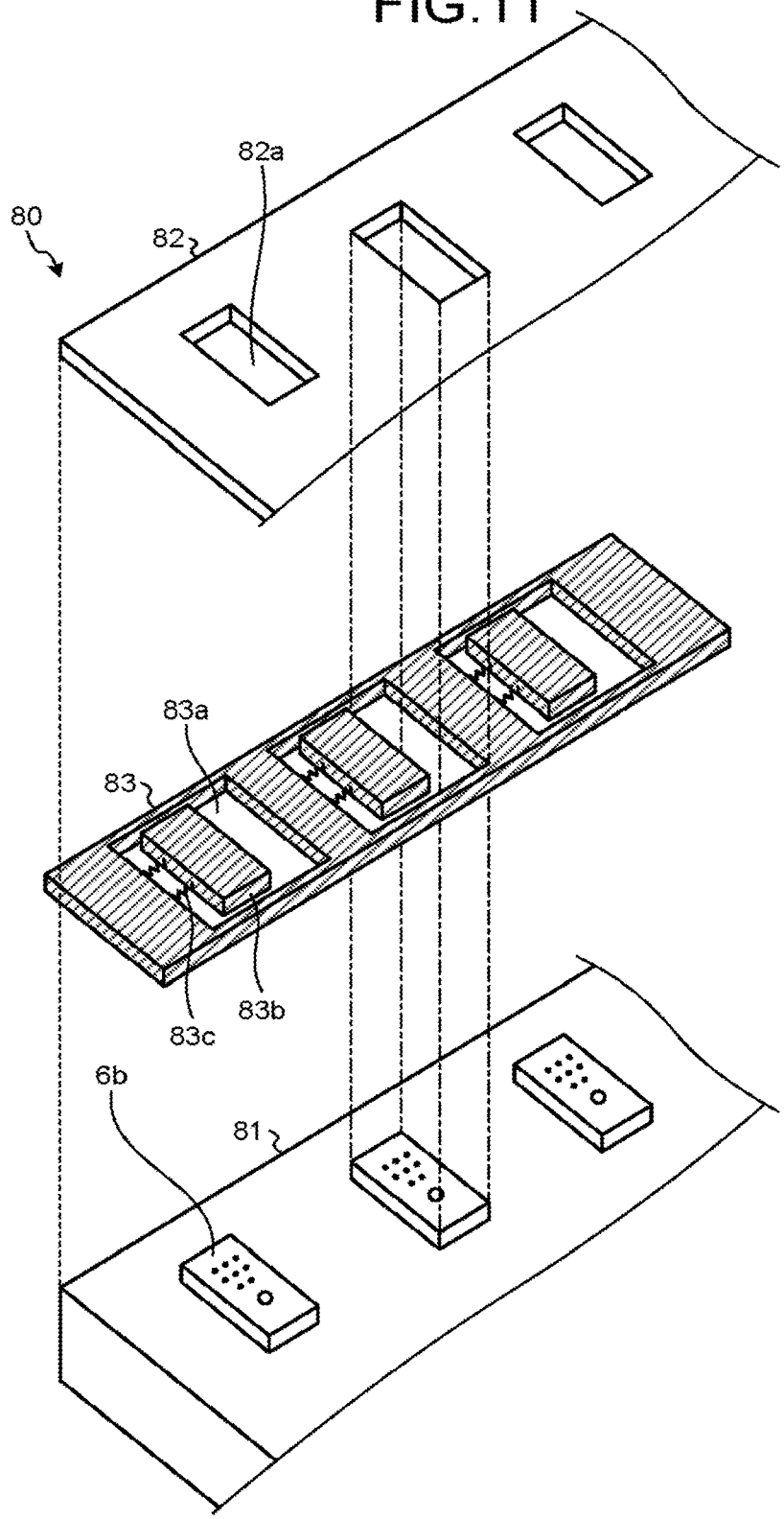
FIGS. 11 to 13 are drawings illustrating an example of a lid mechanism provided on a couchtop according to a fifth embodiment.
Figure 12:
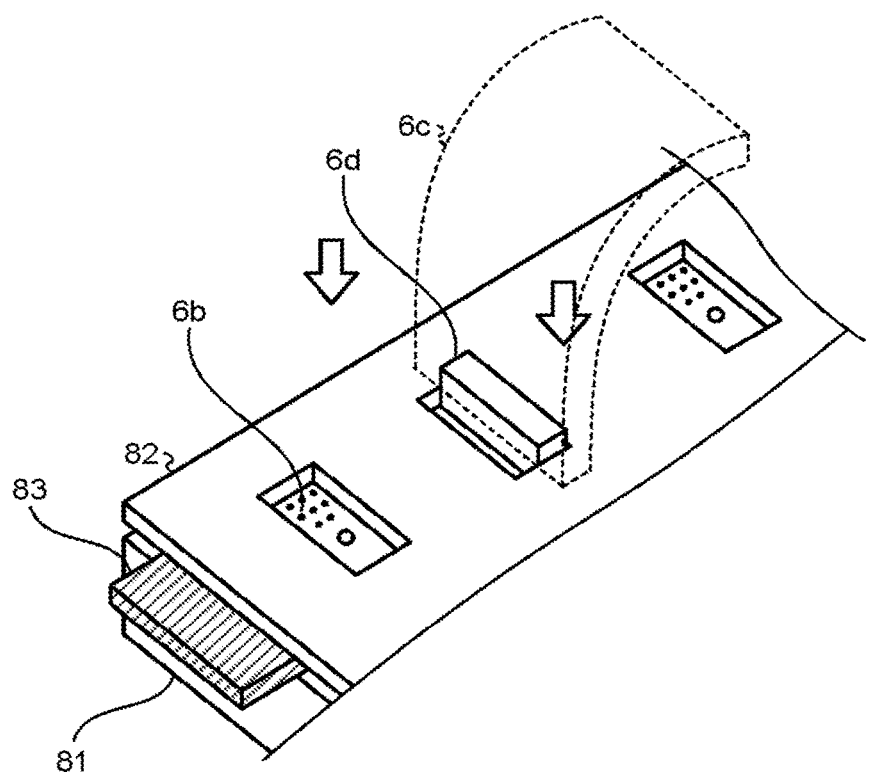
Figure 13:
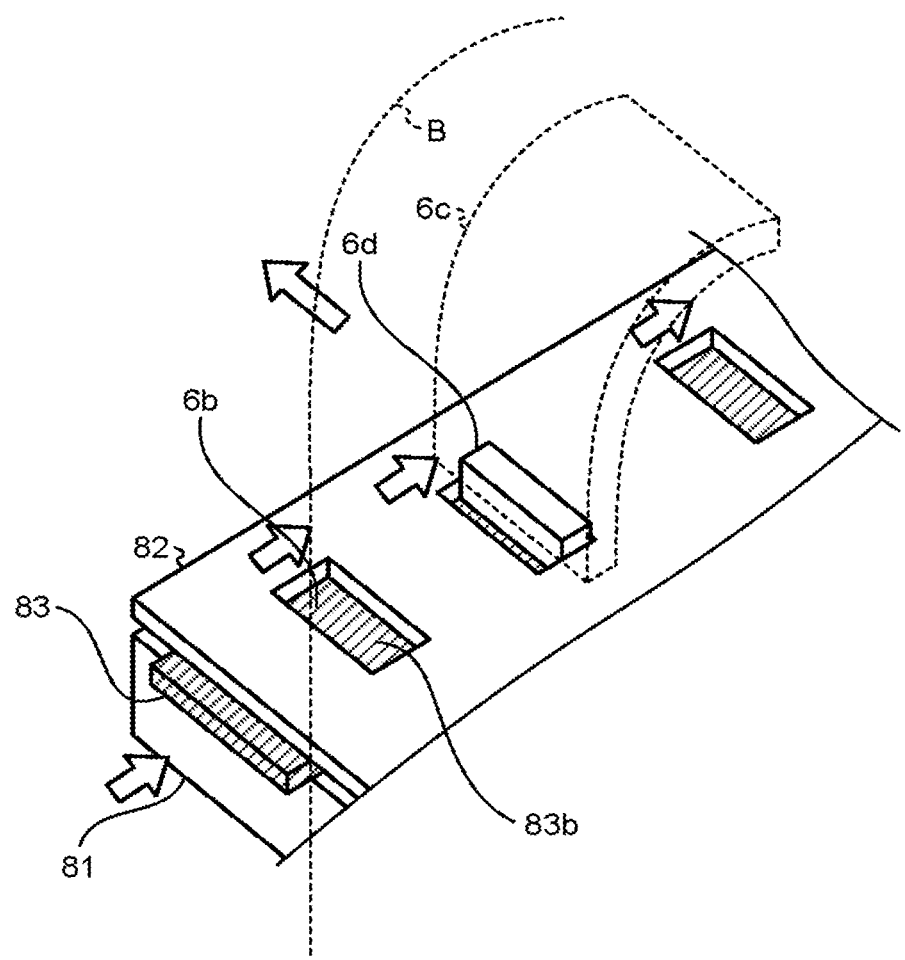

FIGS. 11 to 13 are drawings illustrating an example of the lid mechanism provided on a couchtop according to the fifth embodiment. For example, as illustrated in FIG. 11, a lid mechanism 80 according to the fifth embodiment is provided as a part of the couchtop 8a and includes a couchtop basal section 81, a couchtop cover 82, and a frame 83.

The couchtop basal section 81 is a plate-like stage arranged in a lower part of the couchtop 8a and is provided with two or more of the connectors 6b described in the embodiments above.

The couchtop cover 82 is a plate-like member formed to have substantially the same size as that of the top face of the couchtop basal section 81. The couchtop cover 82 is arranged on top of the couchtop basal section 81. The couchtop cover 82 has formed therein holes 82a that are positioned so as to oppose the connectors 6b when the couchtop cover 82 is placed on top of the couchtop basal section 81. Each of the holes 82a is formed so as to have substantially the same size as that of the connection surface of a corresponding one of the connectors 6b provided on the couchtop basal section 81. As a result, even when the couchtop cover 82 is placed on top of the couchtop basal section 81, the connection surfaces of the connectors 6b are exposed via the holes 82a.

The frame 83 is a plate-like member arranged between the couchtop basal section 81 and the couchtop cover 82. With respect to the connectors 6b provided on the couchtop basal section 81, one frame 83 is provided for each of the arrays of the connectors 6b arranged along the shorter-side direction. The frame 83 is supported so as to be slidable in the shorter-side direction of the couchtop 8a while being positioned between the couchtop basal section 81 and the couchtop cover 82. Further, the frame 83 has formed therein holes 83a in such positions that are interposed between the connectors 6b provided on the couchtop basal section 81 and the holes 82a formed in the couchtop cover 82, when the frame 83 is placed between the couchtop basal section 81 and the couchtop cover 82. Each of the holes 83a is formed for a corresponding one of the connectors 6b provided on the couchtop basal section 81.

In the present example, each of the holes 83a formed in the frame 83 is shaped to be larger, in terms of the shorter-side direction of the couchtop 8a, than the connection surface of a corresponding one of the connectors 6b and further has a lid member 83b arranged on the inside thereof. On the inside of each of the holes 83a, the lid member 83b is positioned close to one of the sides in terms of the shorter-direction of the couchtop 8a, so that an opening section of the hole 83a resulting from the placement of the lid member 83b has substantially the same size as that of the connection surface of a corresponding one of t connectors 6b. Further, the lid member 83b is urged by a spring 83c attached to an inner wall of the hole 83a, toward the vicinity of the center of the hole 83a along the shorter-side direction of the couchtop 8a. It is also acceptable to use any other elastic member such as rubber, in place of the spring 83c.

Further, as illustrated in FIG. 12, for example, the couchtop basal section 81, the frame 83, and the couchtop cover 82 are placed on top of one another, while the positions of the connection surfaces of the connectors 6b provided or the couchtop basal section 81, the opening sections of the holes 63a formed in the frame 83, and the holes 82a formed in the couchtop cover 82 are aligned with one another. In other words, in the aligned state, the connectors 6b provided on the couchtop 8a side are open, so that it is possible to fit the connector 6d of the coil element 6c to any of the connectors 6b. It should be noted that the frame 83 is shaped so that, in the aligned state, one of the ends thereof juts out beyond the edges of the couchtop basal section 81 and the couchtop cover 82.

In the present example, for instance, as illustrated in FIG. 13, when the jutting end of the frame 63 is pushed in toward the inside of the couchtop 8a, the lid members 83b are thereby moved along the shorter-side direction of the couchtop 8a, so that the connectors 6b are closed by the lid members 83b that have been moved. In that situation, because the lid members 83b provided for the frame 83 are moved at the same time as one another, the connectors 6b arranged in mutually-the-same array along the shorter-side direction of the couchtop 8a are closed at the same time as one another.

Further, in that situation, if the connector 6d of the coil element 6c is attached to at least one of the connectors 6b provided on the couchtop basal section 81, the lid member 83b is pressed against a lateral face of the connector 6d by the urging force of the spring 83c. As a result, the connector 6d is fixed. In other words, the connectors 6b to which no connector 6d of the coil element 6c is attached are closed, and at the same time, the connector 6d of the coil element 6c attached to the connector 6b is fixed to the connector 6b.

As for the timing with which the jutting end of the frame 83 is pushed in, the jutting end may manually be pushed in by the operator with arbitrary timing or may automatically be pushed in as the couchtop 8a is moved. For example, as illustrated in FIG. 13, the frame 83 may be configured so that, when the couchtop 8a is arranged on the inside of the bore B of the gantry 50, the frame 83 is pushed in toward the inside of the couchtop 8a as a result of the jutting end that protrudes on the outside of the couchtop 8a corning in contact with the inner wall of the bore B. With this arrangement, when the couchtop 8a is arranged on the inside of the bore B, the connectors 6b to which no coil element 6c is attached are automatically closed.

As explained above, because the lid mechanism closes altogether the connectors 6b that are provided on the couchtop 8a side and to which no coil element 6c is attached, it is possible to prevent, with certainty, the subject from coming into contact with electrically-live parts of the connectors 6b during imaging processes.

Further, the lid mechanism closes the connectors 6b to which no coil element 6c is attached, and at the same time, arranges the coil element 6c attached to any of the connectors 6b to be fixed to the connector 6b. Accordingly, it is possible to prevent the coil element 6c from jiggling during imaging processes.

Further, because the lid mechanism closes the connectors 6b to which no coil element 6c is attached when the couchtop 8a is arranged on the inside of the bore B, it is possible to automatically close the connectors 6b and to fix the coil element 6c when an imaging process is performed.

Sixth Embodiment

In a sixth embodiment, the MRI apparatus 100 described above is configured so that each of the connectors 6b provided in such a region of the couchtop 8a that is positioned on the inside of the loop of a corresponding one of the coil elements 6a includes at least a pre-amplifier. Generally speaking, a coil element used as a receiver coil has connected thereto various circuits such as a tuning circuit, a matching circuit, a pre-amplifier, and/or the like.

Figure 14:
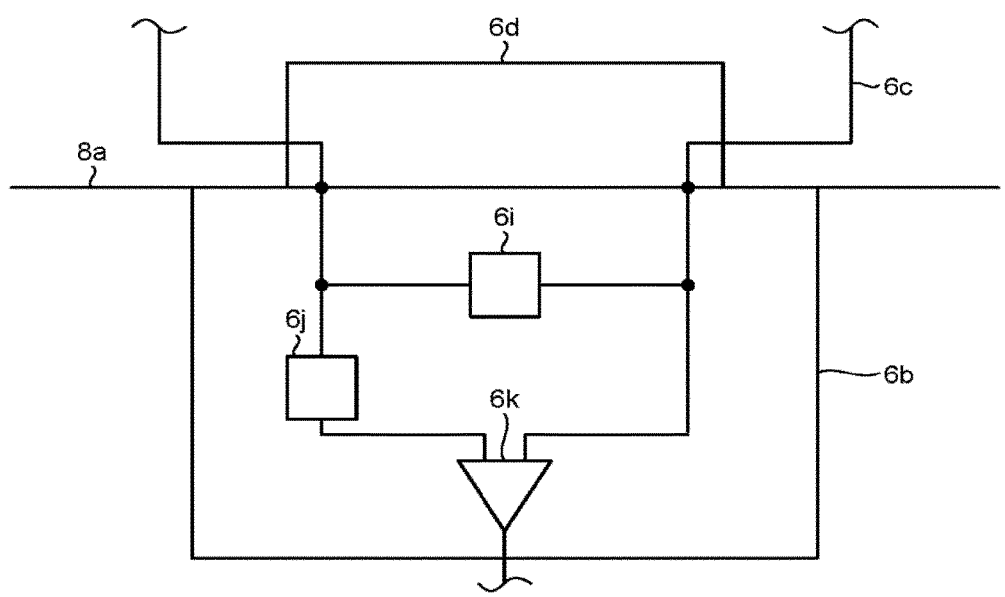
FIG. 14 is a drawing illustrating examples of connectors provided on a couchtop according to a sixth embodiment.

FIG. 14 is a drawing illustrating an example of a connector provided on a couchtop according to the sixth embodiment. FIG. 14 illustrates a situation where a connector 6d of a coil element 6c is attached to a connector 6b provided on the couchtop 8a.

For example, as illustrated in FIG. 14, the connector 6b provided on the couchtop 8a according to the sixth embodiment includes a tuning circuit 6i, a matching circuit 6j, and pre-amplifier 6k. The tuning circuit 6i is configured to arrange the resonance frequency of the coil element 6c to be equal to the Larmor frequency. The matching circuit 6j is configured to match impedances between the coil element 6c and the pre-amplifier 6k. The pre-amplifier 6k is configured to amplify the MR signals received by the coil element 6c and to transmit the amplified MR signals to the receiver circuitry 7.

In the description above, the example is explained in which the tuning circuit 6i, the matching circuit 6j, and the pre-amplifier 6k are provided for the connector 6b provided on the couchtop 8a side; however, possible embodiments are not limited to this example. For instance, it is acceptable to provide one or both of the tuning circuit 6i and the matching circuit 6j for the connector 6d provided on the coil element 6c side.

Further, in the sixth embodiment, the example is explained in which the connector 6b provided on the couchtop 8a side includes at least the pre-amplifier 6k; however, possible embodiments are not limited to this example. For instance, the pre-amplifier 6k may be provided for the connector 6d provided on the coil element 6c side.

The first to the sixth embodiments have thus been explained. In the embodiments described above, the example is explained in which each of the connectors 6b to and from which it is possible to attach and detach the coil element 6c is provided in the region on the inside of the loop of a corresponding one of the coil elements 6a embedded in the couchtop 8a; however, the disclosure of the present application is not limited to this example. For instance, each of the connectors 6b may be provided in such a region of the couchtop 8a where no coil element 6a is provided.

In other words, according to the disclosure of the present application, the coil element 6c is connected, in a cableless manner, to one of the connectors 6b provided in any position of the couchtop 8a. Thus, the position of the connector 6b to which the coil element 6c is attached may be in the region on the inside of the loop of any of the coil elements 6a embedded in the couchtop 8a or may be in such a region of the couchtop 8a where no coil element 6a is provided.

According to at least one aspect of the embodiments described above, it is possible to reduce the cumbersomeness that may be experienced during the handling of the RF coils.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
   a plurality of first coil elements embedded in a couchtop on which a subject is placed; and
   a connector which is provided in a region inside of a loop of at least one of the first coil elements embedded in the couchtop, wherein the connector is configured so that a second coil element different from the first coil elements is attached thereto and detached therefrom.

2. The magnetic resonance imaging apparatus according to claim 1, wherein the second coil element is connected to the connector in a cableless manner.

3. The magnetic resonance imaging apparatus according to claim 1, wherein said at least one of the first coil elements and the second coil element form a radio frequency (RF) coil corresponding to one imaging site as a result of the second coil element being fitted to the connector.

4. The magnetic resonance imaging apparatus according to claim 1, wherein
   each of the first coil elements is arranged in such a manner that a part of a region on an inside of a loop thereof overlaps a region on an inside of a loop of at least another one of the first coil elements, and
   within the region on the inside of the loop of said at least one of the first coil elements, the connector is positioned in a region other than a part overlapping the region on the inside of the loop of said at least another one of the first coil elements.

5. The magnetic resonance imaging apparatus according to claim 4, wherein the connector is provided in the region inside of the loop of said at least one of the first coil elements, so as to be next to an end part of the couchtop while being in the region other than the part overlapping the region on the inside of the loop of said at least another one of the first coil elements.

6. The magnetic resonance imaging apparatus according to claim 1, wherein at least two of the first coil elements are embedded in the couchtop so as to correspond to mutually-different imaging sites.

7. The magnetic resonance imaging apparatus according to claim 6, wherein said at least two of the first coil elements correspond to at least two imaging sites selected from among: a head, a neck, each shoulder, a chest, an abdomen, and each leg.

8. The magnetic resonance imaging apparatus according to claim 1, wherein the connector is electrically connected to the second coil element as a result of being fitted to a connector provided for the second coil element.

9. The magnetic resonance imaging apparatus according to claim 8, wherein the connector provided for the second coil element is configured so as to be movable relative to a loop of the second coil element.

10. The magnetic resonance imaging apparatus according to claim 8, wherein the connector provided in the region inside of the loop of said at least one of the first coil elements includes at least a pre-amplifier.

11. The magnetic resonance imaging apparatus according to claim 1, wherein
    the couchtop includes a projection section or a recess section formed to fit a shape of the subject, and
    the connector is provided in the region inside of the loop of the first coil element embedded in the projection section or the recess section.

12. The magnetic resonance imaging apparatus according to claim 1, wherein the first coil elements include: a first layer including a plurality of coil elements each having a first area size; and a second layer including a plurality of coil elements each having a second area size larger than the first area size, and the first layer and the second layer are embedded in the couchtop while being laminated.

13. The magnetic resonance imaging apparatus according to claim 1, further comprising: a lid mechanism configured to close altogether a plurality of connectors to which no second coil element is attached.

14. The magnetic resonance imaging apparatus according to claim 13, wherein the lid mechanism closes the connectors to which no second coil element is attached, and at a same time, arranges a second coil element attached to any of the connectors to be fixed to the connector.

15. The magnetic resonance imaging apparatus according to claim 14, further comprising: a gantry that has a bore forming an imaging space, wherein the lid mechanism closes the connectors to which no second coil element is attached, when the couchtop is placed on an inside of the bore.

* * * * *